United States Patent
Engler et al.

(10) Patent No.: US 11,566,324 B2
(45) Date of Patent: Jan. 31, 2023

(54) CONDITIONING TREATMENT FOR ALD PRODUCTIVITY

(71) Applicant: Applied Materials, Inc., Santa Clara, CA (US)

(72) Inventors: Christina L. Engler, Union City, CA (US); Lu Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 31 days.

(21) Appl. No.: 16/803,963

(22) Filed: Feb. 27, 2020

(65) Prior Publication Data
US 2021/0269916 A1    Sep. 2, 2021

(51) Int. Cl.
| | |
|---|---|
| C23C 16/34 | (2006.01) |
| H01L 21/285 | (2006.01) |
| C23C 16/455 | (2006.01) |
| H01J 37/32 | (2006.01) |

(52) U.S. Cl.
CPC ........ *C23C 16/34* (2013.01); *C23C 16/45536* (2013.01); *C23C 16/45553* (2013.01); *H01J 37/32853* (2013.01); *H01L 21/28556* (2013.01); *H01J 2237/3321* (2013.01)

(58) Field of Classification Search
None
See application file for complete search history.

(56) References Cited

U.S. PATENT DOCUMENTS

| | | | |
|---|---|---|---|
| 6,554,954 B2 | 4/2003 | Ma | |
| 2004/0038525 A1* | 2/2004 | Meng | ................ C23C 16/45542 438/656 |
| 2005/0016684 A1 | 1/2005 | Sun | |
| 2010/0081292 A1* | 4/2010 | Narushima | .............. G11B 5/84 438/785 |
| 2012/0318457 A1* | 12/2012 | Nguyen | ............ C23C 16/45565 156/345.34 |
| 2019/0185999 A1* | 6/2019 | Shanbhag | ............. C23C 16/405 |

* cited by examiner

*Primary Examiner* — David P Turocy
(74) *Attorney, Agent, or Firm* — Servilla Whitney LLC

(57) ABSTRACT

Deposition methods and apparatus for conditioning a process kit to increase process kit lifetime are described. A nitride film formed on a process kit is exposed to conditioning process comprising nitrogen and hydrogen radicals to condition the nitride film to decrease particulate contamination from the process kit.

12 Claims, 2 Drawing Sheets

CONDITIONING TREATMENT FOR ALD PRODUCTIVITY

TECHNICAL FIELD

Embodiments of the present disclosure generally relate to apparatus and methods for conditioning process chamber components. In particular, embodiments of the disclosure related to methods and apparatus for nitride deposition with improved productivity.

BACKGROUND

Atomic Layer Deposition (ALD) process chambers used for depositing some types of nitride films need frequent cleanings and maintenance. There is a low mean wafer between cleaning (MWBC) due to the properties of the deposition material on the process kit (e.g., consumable parts used in a deposition chamber). The process kit includes, but is not limited to, elements of the deposition chamber that are removable parts that touch reactive chemicals during processing. For example, chamber showerheads, pumping liners, pump shields, etc.

During processing, ALD tantalum nitride (TaN) is deposited on the wafer as well as the process kit. The wafer temperature and process kit temperatures are different, with the wafer temperature being greater than the process kit. Due at least in part to the temperature differences, the TaN deposited on the process kit is different from the film deposited on the wafer. The TaN on the process kit is low density and has high levels of impurities. The TaN formed is powdery and causes particle issues. There are no known in-situ cleaning processes capable of cleaning ALD TaN from the process kit, necessitating long equipment downtimes for cleanings and maintenance.

Additionally, plasma based processes are prone to increased particulate contamination due to plasma-induced stress accumulation on the chamber body. The particle lifetime of a process kit in a plasma process is about 20% of the particle lifetime of a process kit in a thermal process chamber.

Accordingly, there is a need for methods and apparatus to extend the mean wafer between cleaning (MWBC) for nitride deposition processes.

SUMMARY

One or more embodiments of the disclosure are directed to deposition methods comprising exposing a process kit of a process chamber having a nitride film thereon to a conditioning process comprising nitrogen and hydrogen radicals to form a conditioned nitride film. A nitride layer is deposited on a plurality of wafers within the process chamber.

Additional embodiments of the disclosure are directed to deposition methods comprising processing a plurality of wafers within a process chamber to deposit tantalum nitride (TaN) on the wafers and a nitride film on a process kit within the process chamber. The nitride film has a density less than 9 g/cm$^3$. The process kit is conditioned after processing the plurality of wafers using a conditioning process. The conditioning process comprises exposing the process kit to nitrogen and hydrogen radicals to increase the density of the nitride film to greater than 9 g/cm$^3$ and generate a nitride film with compressive stress.

Further embodiments of the disclosure are directed to non-transitory computer readable medium including instructions, that, when executed by a controller of a processing chamber, causes the processing chamber to perform operations of: exposing a substrate to a deposition process condition to deposit a nitride film; and exposing a process kit of the process chamber to a conditioning process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
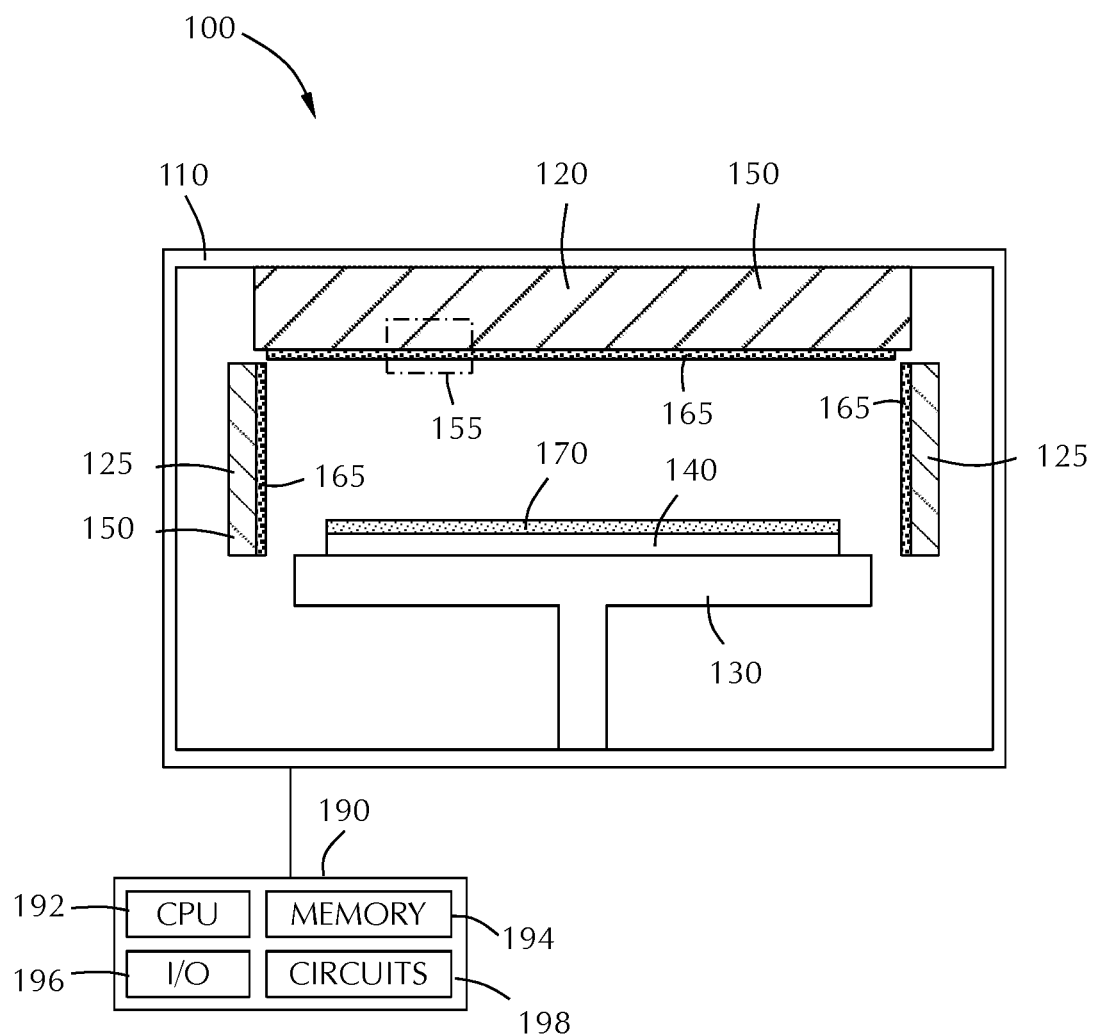
FIG. 1 shows a schematic representation of a process chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure are directed to methods of using a conditioning treatment to improve film properties of a film formed on the process kit. Some embodiments of the disclosure provide a conditioning treatment on one or more of the chamber showerhead, pumping liner, chamber isolator or edge ring. Some embodiments of the disclosure advantageously provide methods of improving adhesion of a film on the process kit during deposition. One or more embodiments advantageously provide methods of reducing particle contamination from a film formed on the process kit. Some embodiments advantageously provide methods of extending the mean-wafer-between-clean (MWBC) for a nitride deposition process.

Some embodiments of the disclosure condition the chamber body using a mixed ammonia, hydrogen and argon plasma treatment to densify the film deposited on the process kit by changing the film composition. In some embodiments, the film deposited on the process kit is treated to increase the density of the film. In some embodiments, the treatment process causes the film material to have a more neutral film-stress. Some embodiments improve the film properties of the material deposited on the process kit so that adhesion to the process kit is improved over time. In some embodiments, adhesion is improved by lowering particle formation in the chamber over time due to delamination, cracking from stressed films and/or showerhead peeling. In some embodiments, the process particle performance is improved to increase the particle lifetime of the process kit. In some embodiments, particle performance is defined by particle adders >32 nm. In some embodiments, particle performance is in the range of less than 5 particle adders (particles that the process adds onto the wafer) greater than 32 nm in size. In some embodiments, the particles are measured using a surface inspection system using, for example, light-scattering. In some embodiments, the particles are measured using a scanning electron microscope (SEM) to determine the particle size based on image analysis. In some embodiments, a particle map and bin sizes are determined by optically measuring the surface topography aberrations that indicate defects on a wafer surface. At smaller particle sizes, the measured particle could be a wafer defect and not a particle added by the process and SEM can be used to view the top of the wafers before or after receiving the defect map from another technique. In some embodiments, SEM images are taken at locations on the defect map at one or more magnifications and be reviewed for the existence of particles, the correct bin size, particle morphology, and/or particle composition.

In some embodiments, an ammonia ($NH_3$)/hydrogen ($H_2$)/argon (Ar) plasma treatment at various powers, process gas flow ratios and/or treatment times improves film density and/or particle performance. Nitridification of an ALD nitride film (e.g., TaN) deposited on the process kit turns the tensile, low density, loose film into a higher density and more stress-neutral film. Unless otherwise specified, the skilled artisan will recognize that the use of terms like "tantalum nitride" or formulae like "TaN" identify the elemental components of the stated material and do not imply any particular stoichiometric relationship of components. For example, TaN, unless otherwise specified, refers to a film having tantalum and nitrogen atoms. In an example using specific stoichiometric values, the low density, tensile film comprising TaN is modified into a higher density, more stress-neutral $Ta_3N_5$.

The films deposited on the process kit during deposition typically have high impurities and forms a powdery material that can cause particle issues, decreasing the MWBC for the chamber in production. Some embodiments of the disclosure modify the film properties deposited on the process kit periodically during kit life to help keep the film adhered to the process kit, make the film denser and/or more stress-neutral so that defects are less likely to occur causing particle issues.

Figure 2:
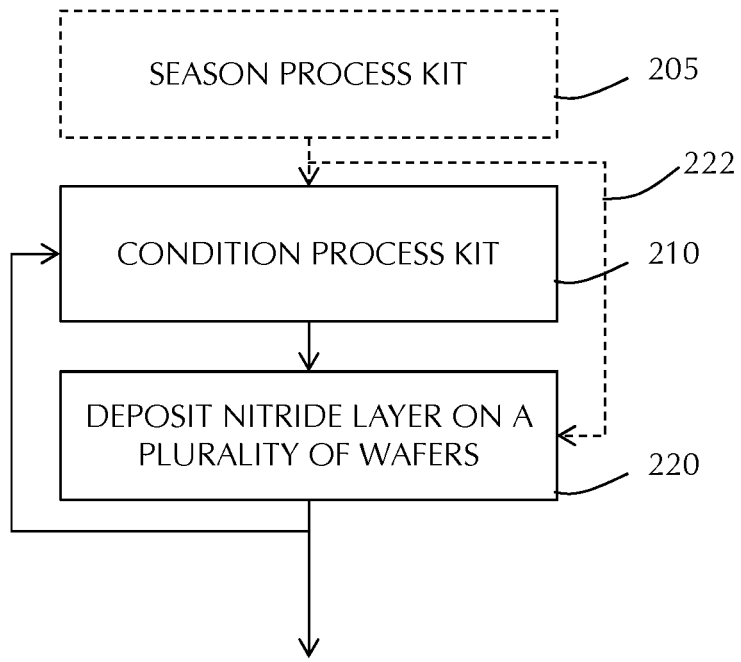
FIG. 2 illustrates a flowchart of a process method according to one or more embodiment of the disclosure.

FIG. 1 shows a process chamber 100, and FIG. 2 shows a process method 200 in according with some embodiments of the disclosure. The process chamber 100 shown in FIG. 1 includes a chamber body 110, a showerhead 120 (or other gas distribution plate), a confinement ring 125 (which may be omitted), a pedestal 130 (or other substrate support), and a wafer 140. The process kit 150 in FIG. 1 comprises the pedestal 130 and confinement ring 125. The process kit 150, having a nitride film 160 thereon, is exposed to a conditioning process 210 to form a conditioned nitride film 165. The conditioning process of some embodiments comprises nitrogen radicals and hydrogen radicals. The method 200 further comprises deposition process 220 in which a nitride layer 170 is deposited on a plurality of wafers 140 within the process chamber 100. The plurality of wafers 140 of some embodiments are processed individually. In some embodiments, deposition occurs on more than one wafer at a time.

During deposition process 220, in which the nitride layer 170 is formed on the wafer 140 surface, some material deposits on the process kit 150 (e.g., showerhead 120 and/or confinement ring 125) as nitride film 160. The nitride film 160 that forms on the process kit 150 has different properties than the nitride layer 170 formed on the wafer 140. Without being bound by any particular theory of operation, the differences in properties between the nitride film 160 and nitride layer 170 are due to, inter alia, temperature differentials between the wafer 140 and the process kit 150.

Figure 3A:
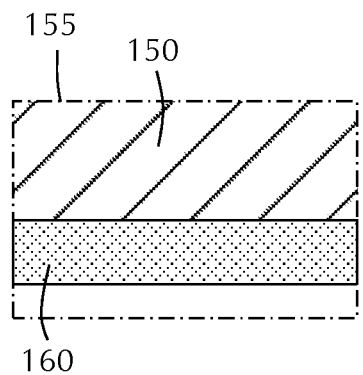
FIG. 3A shows an expanded view of region 155 of FIG. 1 prior to a conditioning process according to one or more embodiment of the disclosure.
Figure 3B:
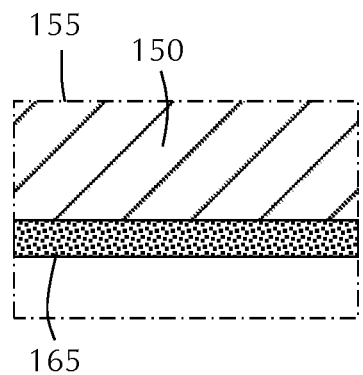
FIG. 3B shows a view of FIG. 3A after a conditioning process according to one or more embodiment of the disclosure.

FIG. 3A illustrates an expanded view of region 155 before the conditioning process 210, and FIG. 3B illustrates the view of FIG. 3A after the conditioning process 210. In FIG. 3A the nitride film 160 formed on the process kit 150 has a relatively low density and is under tensile stress. In some embodiments, the conditioning process 210 increases the density of the nitride film 160 to form the conditioned nitride film 165, as shown in FIG. 3B. The conditioned nitride film 165 may also be referred to as a densified nitride film.

In some embodiments, the nitride film 160 is formed on the process kit 150 during a nitride deposition process to form a nitride layer on one or more wafer. In some embodiments, the nitride layer is deposited by one or more of chemical vapor deposition (CVD) or atomic layer deposition. In some embodiments, the nitride layer and nitride film are deposited by atomic layer deposition. In some embodiments, the nitride layer is deposited on a plurality of wafers at the same time or sequentially.

In some embodiments, the nitride film 160 deposited on the process kit 150 comprises one or more of tantalum nitride (TaN), titanium nitride (TiN), manganese nitride (MnN), tungsten nitride (WN), ruthenium tantalum nitride (RuTaN) or niobium nitride (NbN). In some embodiments, the nitride film 160 deposited on the process kit 150 comprises or consists essentially of tantalum nitride (TaN). As used in this manner, the term "consists essentially of" means that the composition of the film is greater than or equal to 90%, 92.5%, 95%, 98%, 99% or 99% of the sum of the stated elements, on an atomic basis. In some embodiments, the nitride film 160 deposited on the process kit 150 comprises or consists essentially of titanium nitride. In some embodiments, the nitride film 160 deposited on the process kit 150 comprises or consists essentially of niobium nitride.

In some embodiments, the nitride film 160 comprises tantalum nitride with a relatively low density under tensile stress. As used in this manner, the term "relatively low density" means that the density of the tantalum nitride film, prior to the conditioning process, is less than or equal to 8 g/cm$^3$, 7.5 g/cm$^3$, 7 g/cm$^3$, 6.5 g/cm$^3$, 6 g/cm$^3$, 5.5 g/cm$^3$ or 5 g/cm$^3$.

In some embodiments, the tantalum nitride film formed on the process kit has a density, prior to the conditioning process, in the range of 5 g/cm$^3$ to 6.5 g/cm$^3$. In some embodiments, the nitride film 160 formed on the process kit prior to the conditioning process, comprises tantalum nitride with tensile stress. In some embodiments, ellipsometry is used to measure the differential stress in the deposited film with a known thickness (measured by XRF). ALD TaN films prior to treatment are very tensile, ranging from 100 MPa to 1500 MPa in tensile stress. In some embodiments, after treatment the ALD Ta$_3$N$_5$ film is more stress neutral/compressive. In some embodiments, the stress of the treated film is in the range of 0 to −500 MPa. In some embodiments, ellipsometry is used to measure the radius of curvature of the wafer before and after film deposition. The curvature delta is used to calculate the film stress with the known film thickness.

The conditioning process 210 changes the nitride film 160 into the conditioned nitride film 165. The conditioned nitride film 165 of some embodiments has a density greater than or equal to 9 g/cm$^3$, 9.5 g/cm$^3$ or 10 g/cm$^3$. In some embodiments, the conditioned nitride film 165 comprises tantalum nitride with a density in the range of 9 g/cm$^3$ to 10.5 g/cm$^3$, or 9.5 g/cm$^3$ to 10 g/cm$^3$.

In some embodiments, the conditioned nitride film has a compressive stress. In some embodiments, the compressive stress is in the range of about 0 to about −500 MPa, as measured by ellipsometry.

The conditioning process of some embodiments comprises nitrogen radicals and hydrogen radicals. In some embodiments, the nitrogen radicals and hydrogen radicals are formed by passing a conditioning gas across a hot wire. In some embodiments, the nitrogen radicals and hydrogen radicals are formed within a plasma generated from a conditioning gas. In some embodiments, the plasma is a direct plasma. In some embodiments, the plasma is a remote plasma.

The conditioning gas of some embodiments comprises one or more of ammonia (NH$_3$), hydrazine (N$_2$H$_4$), nitrogen (N$_2$), hydrogen (H$_2$) or argon (Ar). The conditioning gas of some embodiments comprises one or more of ammonia (NH$_3$), hydrazine (N$_2$H$_4$), nitrogen (N$_2$), hydrogen (H$_2$) or argon (Ar), with the proviso that each of nitrogen (N$_2$), hydrogen (H$_2$) or argon (Ar) are used with at least one additional gaseous species to provide nitrogen and hydrogen radicals. In some embodiments, the conditioning gas comprises an ammonia hydrogen compound (azane). In some embodiments, the conditioning gas comprises one or more of diazane (hydrazine), triazane (N$_3$H$_5$), diazene (N$_2$H$_2$) or triazene (N$_3$H$_3$). In some embodiments, the conditioning gas comprises at least one species having both nitrogen atoms and hydrogen atoms. In some embodiments, the conditioning gas comprises or consists essentially of ammonia (NH$_3$). As used in this manner, the term "consists essentially of" means that the active species within the conditioning gas are greater than or equal to 95%, 98%, 99% or 99.5% of the stated species on a molecular basis, or sum of the states specie, without counting inert or diluent species. In some embodiments, the conditioning gas comprises or consists essentially of hydrazine (N$_2$H$_4$). In some embodiments, the conditioning gas comprises or consists essentially of ammonia and hydrogen (H$_2$). In some embodiments, the conditioning gas comprises or consists essentially of hydrogen (H$_2$) and nitrogen (N$_2$).

In some embodiments, the conditioning gas comprises ammonia (NH$_3$), hydrogen (H$_2$) and argon (Ar). In some embodiments, the conditioning gas consists essentially of ammonia (NH$_3$), hydrogen (H$_2$) and argon (Ar). The ratio of ammonia:hydrogen:argon (NH$_3$:H$_2$:Ar) of some embodiments, is in the range of 0.9-1.1 NH$_3$: 0.9-1.1 H$_2$: 0.9-1.1 Ar. In some embodiments, the ratio of ammonia:hydrogen:argon (NH$_3$:H$_2$:Ar) is about 1:1:1. In some embodiments, the ratio of ammonia:hydrogen:argon (NH$_3$:H$_2$:Ar) is in the range of 1-20 NH$_3$:1-20 H$_2$:1 Ar, or in the range of 1-10:1-10:1, or in the range of 10:10:0.1-10 Ar. In some embodiments, the amount of ammonia (NH$_3$) and hydrogen (H$_2$) is within ±10% relative and the argon (Ar) is a diluent of any appropriate amount to provide enough reactive species in the process chamber.

In some embodiments, the conditioning gas comprises a plasma with a frequency in the range of about 2 MHz to 100 MHz, 13.56 MHz to 60 MHz, 13.56 MHz to 40 MHz. In some embodiments, the conditioning gas comprises a plasma with a pressure in the range of about 0.5 torr to about 25 torr (about 67 pascals to about 3333 pascals), or in the range of about 1 torr to 15 torr (about 133 pascals to about 2000 pascals, or in the range of about 1.5 torr to about 10 torr (about 200 pascals to about 1333 pascals). In some embodiments, the conditioning gas comprises a plasma and the conditioning process is performed for less than or equal to five minutes.

Referring to FIG. 2, after the conditioning process 210, a nitride layer is deposited 220 on one or more wafers (substrates). The number of wafers deposited on before re-conditioning the process kit 150 depends on, for example, the conditioning process parameters used, the deposition parameters and nitride layer composition. The number of wafers between re-conditioning using the conditioning process 210 of some embodiments is in the range of 5 to 50 wafers. In some embodiments, following method 200 increases the lifetime of the process kit 150 by at least 5× relative to a process kit without the conditioning process 210 being performed. In some embodiments, the lifetime of the process kit is defined as the number of wafers that can be processed between cleaning or preventative maintenance. For any given process, a typical reference lifetime is in the range of <1 K to 10K.

Some embodiments of the method begin with a seasoning process 205 to season the process kit 150. The seasoning process 205 of some embodiments uses the deposition process 220 followed by the conditioning process 210 to prepare the process kit 150 for use. In some embodiments, the process kit 150 is subjected to the seasoning process 205 prior to installation in a deposition chamber. In some embodiments, the seasoning process 205 comprises a form of the deposition process followed by a form of the conditioning process. In some embodiments, the seasoning process comprises a form of the deposition process and the method 200 moves to the conditioning process 210 as a next procedure to condition and complete the seasoning process. In some embodiments in which the seasoning process includes a form of the conditioning process, after the seasoning process 205, the method 200 proceeds to the deposition process 220, following optional path 222.

With reference to FIG. 1, additional embodiments of the disclosure are directed to process chambers 100 for executing the methods described herein. FIG. 1 illustrates a chamber 100 that can be used to process a substrate according to one or more embodiment of the disclosure. The process chamber 100 comprises at least one controller 190 configured to control various components of the chamber 100. In some embodiments, there is more than processor connected to the process chamber 100 with a primary control processor coupled to each of the separate processors to control the chamber 100. The controller 190 may be one of any form of general-purpose computer processor, microcontroller, microprocessor, etc., that can be used in an industrial setting for controlling various chambers and sub-processors.

In some embodiments, the controller 190 has a processor 192 (also referred to as a CPU), a memory 194 coupled to the processor 192, input/output devices 196 coupled to the processor 192, and support circuits 198 to communication between the different electronic components. In some embodiments, the memory 194 includes one or more of transitory memory (e.g., random access memory) or non-transitory memory (e.g., storage).

The memory 194, or computer-readable medium, of the processor may be one or more of readily available memory such as random access memory (RAM), read-only memory (ROM), floppy disk, hard disk, or any other form of digital storage, local or remote. The memory 194 can retain an instruction set that is operable by the processor 192 to control parameters and components of the system. The support circuits 198 are coupled to the processor 192 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 190 has one or more configurations to execute individual processes or sub-processes to perform the method. In some embodiments, the controller 190 is connected to and configured to operate intermediate components to perform the functions of the methods. For example, the controller 190 of some embodiments is connected to and configured to control one or more of gas valves, actuators, motors, slit valves, vacuum control, etc.

The controller 190 of some embodiments has one or more configurations selected from: a configuration to expose a substrate to a deposition process condition to deposit a nitride film; a configuration to expose a process kit of the process chamber to a conditioning process. A non-transitory computer readable medium including instructions, that, when executed by a controller of a processing chamber, causes the processing chamber to perform operations of: exposing a substrate to a deposition process condition to deposit a nitride film; and exposing a process kit of the process chamber to a conditioning process.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A deposition method comprising:
exposing a process kit of a process chamber having a nitride film comprising one or more of tantalum nitride (TaN), ruthenium tantalum nitride (RuTaN), manganese nitride (MnN), tungsten nitride (WN) or niobium nitride (NbN) thereon to a conditioning process when no wafer is present in the process chamber, the nitride film on the processing kit having a tensile stress in the range of from 100 MPa to 1500 MPa, as measured by ellipsometry, the conditioning process comprising exposing the process kit to a conditioning gas, wherein the conditioning gas consists essentially of ammonia, hydrogen and argon ($NH_3:H_2:Ar$) ratio in the range of 0.9-1.1:0.9-1.1:0.9-1.1 and nitrogen and hydrogen radicals to form a conditioned nitride film, wherein the conditioning process increases a density of the nitride film on the process kit, the nitride film having a density less than or equal to 8 $g/cm^3$ and the conditioned nitride film having a density greater than or equal to 10 $g/cm^3$, modifies stress of the nitride film having the tensile stress to the conditioned film having a compressive stress in the range of from 0 MPa to −500 MPa, as measured by ellipsometry, and increases a lifetime of the process kit by at least 5× relative to a process without the conditioning process; and
depositing a nitride layer on a plurality of wafers within the process.

2. The method of claim 1, wherein the conditioned nitride film comprises tantalum nitride (TaN).

3. The method of claim 1, wherein the nitride layer on the plurality of wafers is deposited by atomic layer deposition.

4. The method of claim 3, wherein the nitride film on the process kit is formed during deposition of the nitride layer on a wafer.

5. The method of claim 1, wherein the conditioning process comprises a plasma formed from the conditioning gas, the conditioning gas comprising at least one plasma species having nitrogen and hydrogen atoms.

6. The method of claim 5, wherein the plasma has a frequency in the range of 13.56 to 40 MHz.

7. The method of claim 5, wherein the plasma has a pressure in the range of 1.5 to 10 torr.

8. The method of claim 5, wherein the conditioning process is performed for less than or equal to five minutes.

9. The method of claim 1, wherein the plurality of wafers is in the range of 5 to 50 before an additional exposure to the conditioning process.

10. The method of claim 1, wherein the process kit comprises one or more of a showerhead, pumping liner or edge ring.

11. A deposition method comprising:
processing a plurality of wafers within a process chamber to deposit tantalum nitride (TaN) on the wafers and a nitride film comprising one or more of tantalum nitride (TaN), ruthenium tantalum nitride (RuTaN), manganese nitride (MnN), tungsten nitride (WN) or niobium nitride (NbN) on a process kit within the process chamber, the nitride film having a density less than 9 g/cm$^3$ and a tensile stress in the range of from 100 MPa to 1500 MPa, as measured by ellipsometry; and
conditioning the process kit when no wafer is present in the process chamber using a conditioning process, the conditioning process comprising exposing the process kit to a conditioning gas, wherein the conditioning gas consists essentially of ammonia, hydrogen and argon ($NH_3$:$H_2$:Ar) ratio in the range of 0.9-1.1:0.9-1.1:0.9-1.1 and nitrogen and hydrogen radicals to increase the density of the nitride film to greater than 9 g/cm$^3$ and generate a nitride film with compressive stress in the range of from 0 MPa to −500 MPa, as measured by ellipsometry, the conditioning process increasing a lifetime of the process kit by at least 5× relative to a process without the conditioning process.

12. The method of claim 11, wherein the plurality of wafers is in the range of 5 to 50.

* * * * *